United States Patent [19]

Ozaki

[11] Patent Number: 4,789,966
[45] Date of Patent: Dec. 6, 1988

[54] SEMICONDUCTOR MEMORY DEVICE WITH PAGE AND NIBBLE MODES

[75] Inventor: Hideyuki Ozaki, Itami, Japan

[73] Assignee: Mitsubishi Denki Kabushiki, Hyogo, Japan

[21] Appl. No.: 933,806

[22] Filed: Nov. 24, 1986

[30] Foreign Application Priority Data

Dec. 11, 1985 [JP] Japan ................................ 60-278509

[51] Int. Cl.$^4$ ........................ G11C 7/00; G11C 11/40; G11C 8/00
[52] U.S. Cl. .................................................... 365/189
[58] Field of Search ................................ 365/230, 189

[56] References Cited

U.S. PATENT DOCUMENTS

| | | | |
|---|---|---|---|
| 4,207,556 | 6/1980 | Sugiyama et al. | 365/96 X |
| 4,238,839 | 12/1980 | Redfern et al. | 365/96 |
| 4,446,534 | 5/1984 | Smith | 365/96 |
| 4,586,167 | 4/1986 | Fujishima et al. | 365/189 |
| 4,675,850 | 6/1987 | Kumanoya et al. | 365/189 X |

OTHER PUBLICATIONS

Fujishima et al., *A 256K Dynamic RAM with Page-Nibble Mode*, IEEE Journal of Solid State Circuits vol. SC-18, No. 5, Oct. 1983.

Mohsen et al., "The Design and Performance of CMOS 256K Bit DRAM Devices", SC-19, IEE J. Solid-State Circuits, pp. 610–618 (1984).

*Primary Examiner*—Stuart N. Hecker
*Assistant Examiner*—Alyssa H. Bowler
*Attorney, Agent, or Firm*—Saidman, Sterne, Kessler & Goldstein

[57] ABSTRACT

In a semiconductor memory device comprising a memory cell array and array control circuit for controlling the memory cell array and being operable in a page mode or a nibble mode, a mode selection circuit is provided for selective connection for operation in the page mode or for operation in the nibble mode. The mode selection circuit of the invention comprises fuse means which can be blown or left unblown for the selective connection.

5 Claims, 3 Drawing Sheets

SEMICONDUCTOR MEMORY DEVICE WITH PAGE AND NIBBLE MODES

BACKGROUND OF THE INVENTION

The present invention relates to a semiconductor memory device, and particularly a DRAM (dynamic random access memory) formed of an IC chip which is capable of selective connection, in the process of production, for operation in a page mode or for operation in a nibble mode.

In recent years, two types of DRAMs, namely those operable in the page mode and those operable in the nibble mode are widely used. To avoid the necessity to prepare two different types of IC chips for the respective modes, thereby to improve design efficiency and production efficiency, the memory manufacturers make arrangement to prepare memories (half-finished) of identical configuration (IC chips) and to prepare two different masks for forming aluminum interconnection, or to form additional bonding pads, so that by selective use of the masks for forming interconnection or the bonding pads, the memories (final products) which operate in the desired mode can be ultimately obtained.

As an example, an arrangement where masks for forming aluminum interconnection are used for the selective production will be described.

FIG. 1 is a block diagram showing a DRAM on which the aluminum interconnection is selectively formed for the selective production. As illustrated, it comprises memory cell arrays CR comprising memory cells arranged in rows and columns to form matrixes, and row decoders RD and column decoders CD. It also comprises array control circuit AC which comprises a CASN buffer, or a first CAS buffer 1, and a CAS buffer or a second CAS buffer 2.

A feature of this DRAM is the provision of the two buffers 1, 2. The output signal of the CASN buffer 1 is used to control a write buffer 3, a data input buffer 4, a four-bit shift register 5, an output buffer 6 and a 1-of-4 data I/O gating circuit 7. The output signal of the CAS buffer 2 is used to control an address buffer 8, column decoders 9 and pre-amplifiers 10.

The CAS buffer circuit 2 includes a mode selection circuit 11, shown to be a switch which connects a node 11C to either a node 11A or a node 11B. The node 11A is connected to the output $\phi D$ of a circuit comprising transistors 12, 13. The node 11B is connected to a voltage source Vcc. For production of a memory operable in the page mode, aluminum interconnection is formed to connect the node 11C to the node 11B. For production of a memory operable in the nibble mode, aluminum interconnection is formed to connect the node 11C to the node 11A. For this purpose, two types of masks for forming aluminum interconnection are prepared, and one of them is used depending on which type of the memory is desired.

The operation of the DRAM will now be described.

FIG. 2 shows a $\overline{RAS}$ signal, a CASN signal, a $\phi D$ signal and CAS signal generated in the chip where the node 11C is connected to the node 11A, i e., where the memory is operable in the nibble mode. As will be seen from FIG. 2, the CASN signal is an inversion of an external $\overline{CAS}$ signal and in synchronism with the external $\overline{CAS}$ signal. The $\phi D$ signal falls to the "L" level when the CASN signal rises to "H" (so that the transistor 13 conducts while the transistor 12 is nonconductive), and is held at "L" until the $\overline{RAS}$ signal rises to "H". The CAS signal outputted from the CAS buffer 2 having a NAND gate formed of transistors 14, 15 rises to "H" as the external $\overline{CAS}$ signal falls to "L", and is held at "H" even if the external $\overline{CAS}$ signal thereafter rises to "H". The CAS signal falls to "L" when the $\phi D$ signal rises to "H", i.e., the external $\overline{RAS}$ signal rises to "H".

With such an arrangement, the write buffer 3, the data input buffer 4, the four-bit shift register 5, the output buffer 6, and the I/O gating circuit 7 are fed with the CASN signal in synchronism with the external $\overline{CAS}$ signal, so that they are operated in synchronism with the external CAS signal.

The address buffer 8, the column decoders 9 and the preamplifiers 10, which are controlled by the CAS signal, begin operation upon the CAS signal rising to "H" and continue to be in the operating state until the external $\overline{RAS}$ signal rises to "H". The operation in the nibble mode is thereby achieved.

For production of a memory operable in the page mode, the node 11C is connected to the node 11B, i.e., to the power source Vcc. The transistor 14 is therefore kept conductive. The CAS buffer 2 is equivalently identical to the CASN buffer 1, so that the CAS signal is in synchronism with the external $\overline{CAS}$ signal. The address buffer 8, the column decoders 9 and the preamplifiers 10 repeat being set and reset. The operation in the page mode is thereby achieved.

A disadvantage of the above-described prior art memory device is the necessity to prepare two different types of masks for forming aluminum interconnection. Moreover, it is necessary to manage manufacture as to which of the masks should be used for the particular production. Furthermore, since the selective formation of the interconnection is conducted during the wafer process, it is difficult to meet an urgent demand, e.g., an order with a short delivery time.

In the other of the above-mentioned prior art, where special pads are formed, the selective formation can be conducted during the assembly, so that it is easier to meet an urgent demand. But, this arrangement is disadvantageous in that the pads require a relatively large area, so that the loss is considerable particularly with mass-produced DRAMs.

SUMMARY OF THE INVENTION

An object of the invention is to eliminate the above described problems and to enable selective production of a semiconductor memory device for the page mode or the nibble mode without difficulty in the production management, and in meeting an urgent demand, and without requiring a large area.

In recent years, the capacity of DRAMs is further increased, and as a result, use of a redundancy is inevitable. The present inventor has recognized the usefulness of a fuse, in a redundancy circuit, in an attempt to solve the above-described problems, and has found that use of a fuse for the mode selection circuit for the selective production for the page mode or the nibble mode will solve the above described problems.

According to the invention, there is provided a semiconductor memory device comprising
a memory cell array, and
array control means for controlling the memory cell array and being operable in a page mode or a nibble mode and comprising mode selection means for selective connection for operation in the page mode or for operation in the nibble mode, said mode selection means comprises fuse means which can be blown or left unblown for the selective connection.

DETAILED DESCRIPTION OF THE PREFERRED EMBODIMENTS

Figure 3:
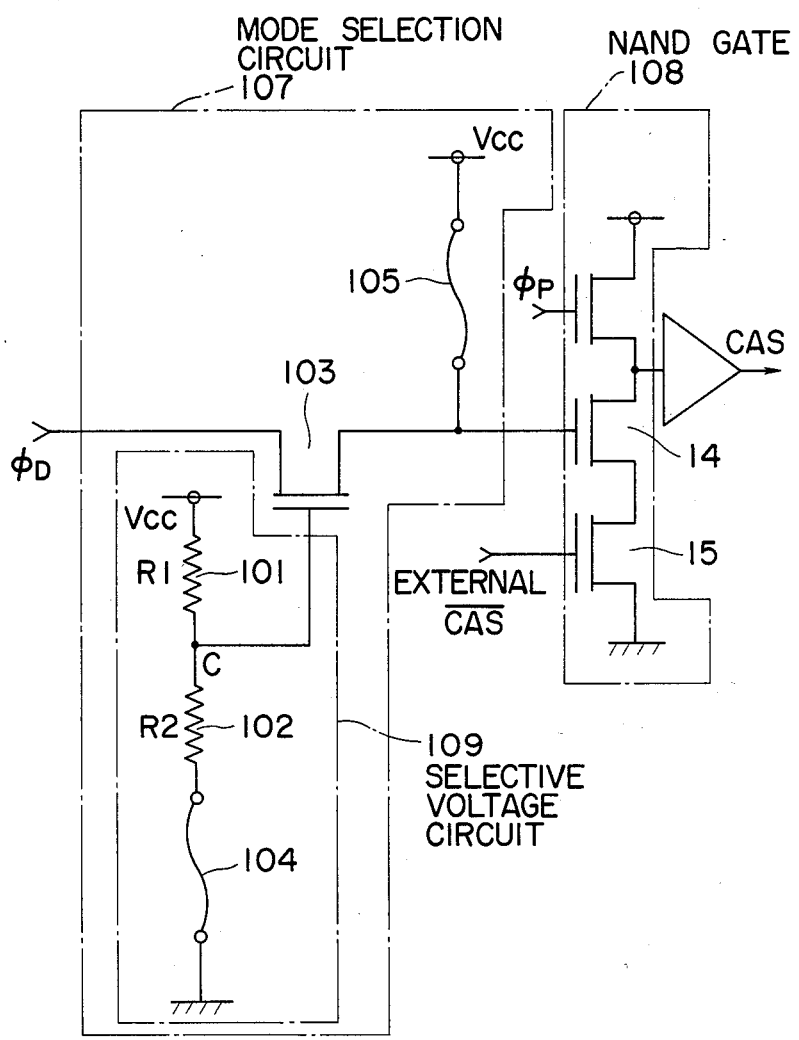
FIG. 3 is a circuit diagram showing an example of a mode selection circuit as incorporated in a semiconductor memory according to the invention.

FIG. 3 shows an example of a mode selection circuit which may be incorporated in place of the mode selection circuit 11 in the semiconductor memory device shown and described with reference to FIG. 1.

As illustrated, the mode selection circuit 107 comprises a first resistor 101 having one end connected to a power source Vcc, a first fuse 104 in series with the first resistor 101 and having one end grounded, and a second resistor 102 connecting the second ends of the first resistor 101 and the first fuse 104. The series circuit of the resistors 101 and 102, and the fuse 104 form, in combination, a selective voltage circuit 109. The junction C between the resistors 101 and 102 constitutes an output of the selective voltage circuit 109.

The resistance R2 of the second resistor 102 is substantially smaller than the resistance R1 of the first resistor 101. As a result, the selective voltage circuit 109 produces a voltage of a ground potential when the fuse 104 is unblown. When the fuse 104 is blown, the selective voltage circuit 109 produces a voltage of the power source Vcc.

The mode selection circuit 107 further comprises an N-channel MOS transistor 103 and a second fuse 105. The MOS transistor 103 is connected to receive, at its gate, the output of the selective voltage circuit 107. The drain of the MOS transistor 103 is connected to receive the $\phi D$ signal. The source of the MOS transistor 103 is connected through the second fuse 105 to the power source Vcc.

Figure 1:
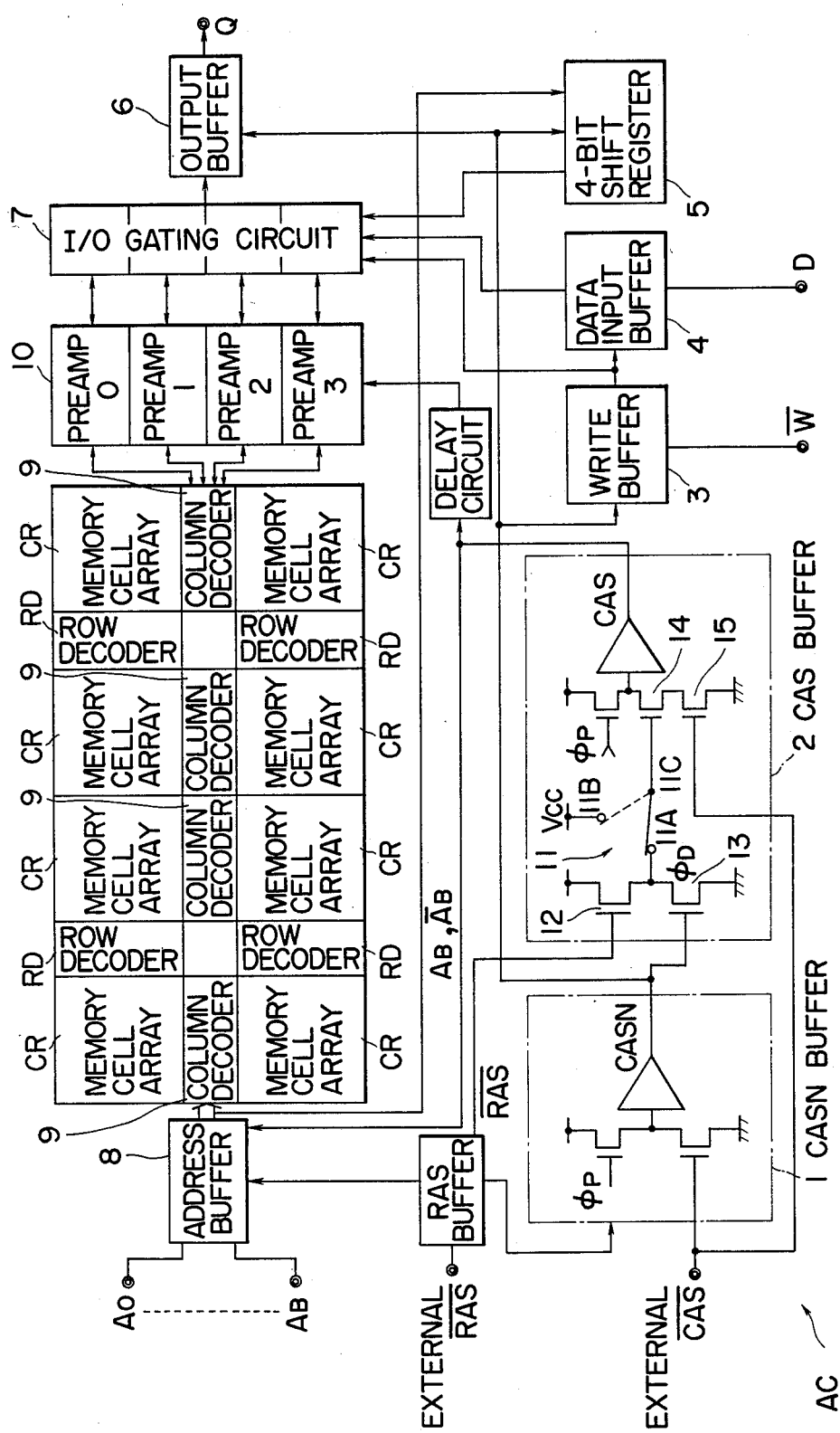
FIG.1 is a block diagram showing a semiconductor memory device with a conventional mode selection circuit.
Figure 2:
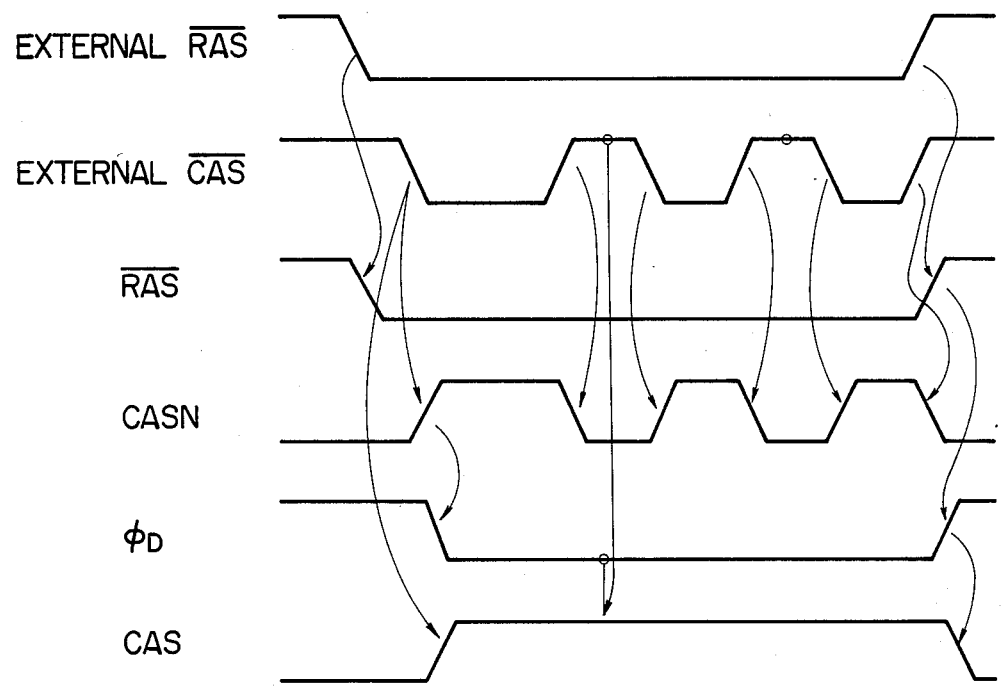
FIG.2 is a waveform diagram showing various signals which appear in the device of FIG. 1.

The source of the MOS transistor 103 constitutes the output of the selective voltage circuit 107, and is connected to the gate of a MOS transistor 14 forming a part of a NAND gate circuit 108 similar to that shown in FIG. 1.

The fuses 104 and 105 are selectively blown (or not blown) during the assembly process depending on which type of the memory is desired. In the illustrated embodiment, the fuses 104 and 105 are both left unblown if a memory operable in the page mode is to be produced, while the fuses 104 and 105 are both blown if a memory operable in the nibble mode is to be produced. This will be explained below.

If the fuses 104 and 105 are both left unblown, the output C of the selective voltage circuit 109 is at the ground potential, as described above, so that the transistor 103 is kept nonconductive, and its source is held at the voltage of the power source Vcc. As a result, the transistor 14 is kept conductive. This is a situation similar to that where, in the prior art device of FIG. 1, the node 11C is connected to the node 11B. The memory will therefore operate in the page mode.

If the fuses 104 and 106 are both blown, the output C of the selective voltage circuit 109 is at the power source voltage, as described above, so that the transistor 103 is conductive, and the $\phi D$ signal at the drain of the transistor 103 is transferred to the source. The transistor 14 is controlled by the $\phi D$ signal. This is a situation similar to that where, in the prior art device of FIG. 1, the node 11C is connected to the node 11A. The memory will therefore operate in the nibble mode.

The fuses may be blown during any of various processes. For example, the fuse may be blown during assembly, i.e., after the wafer process, by using a laser beam.

In the embodiment described above, blowing the fuses results in a memory for the nibble mode, while a memory for the page mode is obtained by leaving the fuses unblown. But, the arrangement may be opposite: blowing the fuses results in a memory for the page, while a memory for the nibble mode is obtained by leaving the fuses unblown. One consideration to be made in this connection is that by making such an arrangement that memories for one of the two modes which are more often required are obtained by leaving the fuses unblown, the step of blowing the fuses need not be conducted for the memories which are more often produced. The total or average production steps can thereby reduced.

The first and the second resistors 101 and 102 may be replaced by MOS transistors. The positions of the second resistor 102 and the fuse 104 may be reversed. The second resistor 102 may be eliminated, in which case the second ends of the fuse 104 and the first resistor 101 may be directly connected to form the output C of the selective voltage circuit 109.

As has been described, according to the invention, the selective connection for the page mode or the nibble mode is achieved by selective blowing of the fuse. As a result, the difficulty in the production management encountered where the masks for forming aluminum interconnection are selectively used. Moreover, a large loss in the chip area which is caused where the special bonding pads are formed can be avoided. Furthermore, by making such an arrangement where the fuses are blown during assembly, it is possible to meet an urgent demand.

What is claimed is:

1. A semiconductor memory device comprising:
   a memory cell array, comprising memory cells arranged in rows and columns to form a matrix;
   array control means for controlling the memory cell array and being operable in a page mode or a nibble mode, said array control means comprising
   a first CAS buffer circuit responsive to an external $\overline{CAS}$ signal for producing an internal CAS signal in synchronism with the external $\overline{CAS}$ signal, and
   a second CAS buffer circuit which comprises a mode selection means for selective connection for operation in the page mode or the nibble mode, and a NAND gate for receiving the output of the mode selection means and the external $\overline{CAS}$ signal to produce an internal CAS signal; and
   said mode selection means comprising:
   a selective voltage circuit comprising a first fuse, connected to produce a ground potential when the first fuse is unblown and producing a power source voltage (Vcc) when the first fuse is blown, and a MOS transistor receiving, at its gate, the output of said selective voltage circuit and having its drain connected to receive a first signal ($\phi$D) related to the internal CAS signal, and its source connected through a second fuse to the power source (Vcc), the source of the MOS transistor forming the output of the mode selection circuit.

2. A device according to claim 1, wherein the fuse means is capable of being blown by laser beam.

3. A device according to claim 1 wherein said first fuse is connected so as to produce a power source voltage (Vcc), when unblown and a ground potential when blown.

4. A device according to claim 1, wherein said selective voltage circuit further comprises:

a resistor having one end connected to the power source (Vcc);
the first fuse being in series with the resistor and having one end connected to the ground potential; and
a node which forms a junction between the resistor and the first fuse consituting the output of the selective voltage circuit.

5. A device according to claim 4, wherein the selective voltage circuit further comprises a second resistor having a smaller resistance than the first-mentioned resistor and connecting together the second ends of the first resistor and the first fuse,
the junction between the second end of the first-mentioned resistor and the second resistor forming the output of the selective voltage circuit.

* * * * *